United States Patent [19]

Aoki et al.

[11] 4,197,472
[45] Apr. 8, 1980

[54] VOLTAGE COMPARATOR HAVING CAPACITIVELY CASCADE-CONNECTED INVERTING AMPLIFIERS

[75] Inventors: Kazuhide Aoki, Kawasaki; Yasuo Nakada, Yokohama, both of Japan

[73] Assignee: Tokyo Shibaura Denki Kabushiki Kaisha, Kawasaki, Japan

[21] Appl. No.: 925,802

[22] Filed: Jul. 18, 1978

[30] Foreign Application Priority Data

Jul. 18, 1977 [JP] Japan .................. 52-85870

[51] Int. Cl.² ................ H03K 5/20; H03K 17/60
[52] U.S. Cl. .................. 307/355; 307/251; 307/297; 307/356
[58] Field of Search ............. 307/240, 243, 251, 355, 307/356, 362, 297, 304

[56] References Cited

U.S. PATENT DOCUMENTS

| | | | |
|---|---|---|---|
| 3,392,341 | 7/1968 | Burns | 307/304 X |
| 3,448,397 | 6/1969 | Lin et al.307 | 304 X/ |
| 3,508,084 | 4/1970 | Warner, Jr. | 307/304 |
| 3,676,702 | 7/1972 | McGrogan, Jr. | 307/251 X |
| 3,706,986 | 12/1972 | Petit et al. | 340/347 AD |
| 3,823,332 | 7/1974 | Feryszka et al. | 307/297 |
| 3,970,875 | 7/1976 | Leehan | 307/297 X |
| 4,008,406 | 2/1977 | Kawagoe | 307/297 X |
| 4,028,558 | 6/1977 | Heller et al. | 307/355 |
| 4,075,509 | 2/1978 | Redfern | 307/355 X |
| 4,100,437 | 7/1978 | Hoff, Jr. | 307/297 |

FOREIGN PATENT DOCUMENTS 52-7709  3/1977  Japan .................. 307/353

*Primary Examiner*—Larry N. Anagnos
*Attorney, Agent, or Firm*—Finnegan, Henderson, Farabow, Garrett & Dunner

[57] ABSTRACT

A voltage comparator suitable for use in an analog-to-digital converter such as a successive-approximation converter which is comprised of a plurality of capacitively cascade-connected inverters to generate an output signal of a logic level 1 or 0 according to the relationship between the magnitudes of two analog input voltage signals to be compared. A bias circuit for impressing a bias voltage on the inputs of the inverters comprises first and second MOS transistor resistor elements connected in series across a power source and a third MOS transistor which is connected in parallel to the second MOS transistor, and whose gate is supplied with a control voltage so that the inverters are respectively biased to the optimum operation point for comparison through adjustment of the control voltage. With another embodiment of this invention, the respective inverters are automatically biased to the optimum operation point for comparison by detection of the bias voltage of inverters.

4 Claims, 8 Drawing Figures

VOLTAGE COMPARATOR HAVING CAPACITIVELY CASCADE-CONNECTED INVERTING AMPLIFIERS

BACKGROUND OF THE INVENTION

This invention relates to a voltage comparator, and more particularly to a voltage comparator formed of a plurality of capacitively cascade-connected inverting amplifiers.

An analog-to-digital converter (hereinafter referred to as "an A/D converter") such as a successive—approximation converter already known in the art comprises a comparator for comparing an unknown analog voltage Va supplied from.k sample-and-hold circuit with a corresponding output voltage Vo from a digital-to-analog (D/A) converter which approximates the unknown analog voltage Va from the sample-and-hold circuit. This voltage comparator produces an output signal of a logic level 1 or 0 according to the relationship between the magnitudes of the voltage signals Va and Vo being compared. As is well known, an output signal from the comparator is conducted to a register section of the A/D converter.

FIG. 1 shows the arrangement of a prior art comparator used in a successive-approximation A/D converter including capacitively cascade—connected inverting amplifiers. The conventional comparator comprises N stages of inventing amplifiers. The respective amplifier stages are comprised of MOS inverters 1-1, 1-2—and 1-N and input-coupling capacitors 2-1, 2-2,—and 2-N. The inputs of inverters 1-1, 1-2,—and 1-N are connected through source-to-drain paths of MOS transistors 3-1, 3-2,—and 3-N to the dividing point of a voltage divider formed of MOS transistors 6 and 7 and connected across a power source $V_{DD}$. The two voltage signals Vo and Va to be compared are alternately applied to the coupling capacitor 21 of the first stage amplifier through source-to-drain paths of MOS transistors 4 and 5. A clock pulse $\phi$ is delivered to the gate electrodes of MOS transistors 3-1, 3-2, 3-N and 4, and a complementary clock pulse $\overline{\phi}$ is supplied to the gate electrode of MOS transistor 5. In FIG. 1, the MOS transistors are of the N-channel type, and the MOS inverters are each formed, as is well known, of an N-channel driving MOS transistor and an N-channel load MOS transistor. Further, all the above-mentioned MOS transistors are of the enhancement type. The MOS transistors 3-1, 3-2, 3-N and 4 are enabled and MOS transistor 5 is disabled when the clock pulse $\phi$ goes high. Conversely, when the clock pulse $\phi$ goes low, that is, when the complementary clock pulse $\overline{\phi}$ goes high, the MOS transistor 5 is enabled, whereas the MOS transistors 3-1, 3-2, 3-N and 4 are disabled. As the result, the voltage signals Vo and Va are alternately coupled to the first stage amplifier during one cycle period of clock pulses $\phi$ and $\overline{\phi}$.

When the MOS transistors 3-1, 3-2 and 3-N are enabled, the inputs of MOS inverters are biased by an output voltage $V_{bias}$ from the voltage divider. Since, at this time, the MOS transistor 4 is enabled, the output voltage Vo from the D/A converter included in the successive-approximation A/D converter is applied to the first stage coupling capacitor 2-1, which in turn is charged to Vo–$V_{bias}$. When the clock pulse $\overline{\phi}$ goes high, the unknown analog voltage Va from the sample-and-hold circuit which is to be converted into a digital signal is supplied to the first stage coupling capacitor 2-1 in place of the output voltage Vo from the D/A converter. At this time, the MOS transistor 3-1 is rendered nonconducting to interrupt the discharging path for the first stage coupling capacitor 2-1. As a result, an input potential of the MOS inverter 1-1 is changed so as to maintain the voltage Vo–$V_{bias}$ across the capacitor 2-1. Thus, the input potential of the MOS inverter 1-1 is changed from the voltage $V_{bias}$ by the extent of Va–Vo. This potential change is progressively invert-amplified through the cascade-connected inverting amplifiers. The level of an output voltage from the last stage amplifier is defined by the relationship between the magnitudes of the two voltage signals Vo and Va being compared as well as by an odd or even number of inverting amplifiers used. The number of the inverting amplifiers can be more reduced, according as the inverting amplifier has a larger amplification factor. The above-mentioned prior art voltage comparator can be integrated with other circuits on a semiconductor chip.

FIG. 2 shows a typical transfer characteristic or input-output characteristic of an inverter. As seen from FIG. 2, each of the inverting amplifiers included in the comparator operates in the best mode when its operation point is set by the bias voltage $V_{bias}$ at the central point P of the transition region of transfer characteristic lying between the output logic levels 1 and 0. Inverters 1-1, 1-2, 1-n formed on the same semiconductor chip have substantially the same transfer characteristic. However, inverters formed on different semiconductor chips unavoidably indicate unequal transfer characteristics due to manufacturing process variations. Further, the resistance values of MOS transistors 6 and 7 constituting the voltage divider vary from chip to chip. Since the supply voltage $V_{DD}$ used is considered to remain unchanged for a number of semiconductor chips manufactured the manufacturing process variations may cause the operation point of the inverter to be displaced from the optimum point. In the worst case, where, for example, the transition region of the transfer characteristic curve is inclined prominently, then the inverter is operated at the point where the bias voltage $V_{bias}$ causes an output voltage signal always to have a logic level of either 1 or 0. In such case, the comparator fails to be properly operated.

SUMMARY OF THE INVENTION

It is accordingly the object of this invention to provide a voltage comparator provided with an improved bias circuit.

A voltage comparator of this invention comprises a plurality of capacitively cascade-connected inverter stages; input circuit means for alternately coupling two input voltage signals to be compared to the inverters; a bias circuit for generating a bias voltage for the inverters; and switch means for coupling the bias voltage to an input of each inverter.

According to one embodiment of the invention, the bias circuit comprises first and second MOS transistors acting as resistor elements connected in series across a power source; and a third MOS transistor which is connected in parallel to the second MOS transistor, and whose gate electrode is impressed with a control voltage. The control voltage may be externally supplied to the gate electrode of the third MOS transistor. This control voltage adjusts the bias voltage applied to the cascade-connected inverters to an optimum level, causing the inverters to act as inverting amplifiers.

A voltage comparator according to another embodiment of the invention comprises a monitor inverter for monitoring the bias voltage; and a control circuit for controlling the third MOS transistor in response to an ouput signal from the monitor inverter, thereby setting the bias voltage at an optimum level. This control circuit comprises a first voltage divider for generating a referential voltage (whose level is equal to the optimum level of the bias voltage); a differential amplifier for producing an output signal proportional to a difference between the output voltages of the first voltage divider and monitor inverter; an integrator for integrating an output signal from the differential amplifier; and a second voltage divider for generating the referential voltage. A sum of ouput voltage of the integrator and output voltage of the second voltage divider is applied to the gate of the third MOS transistor.

DESCRIPTION OF THE PREFERRED EMBODIMENTS

Figure 1:
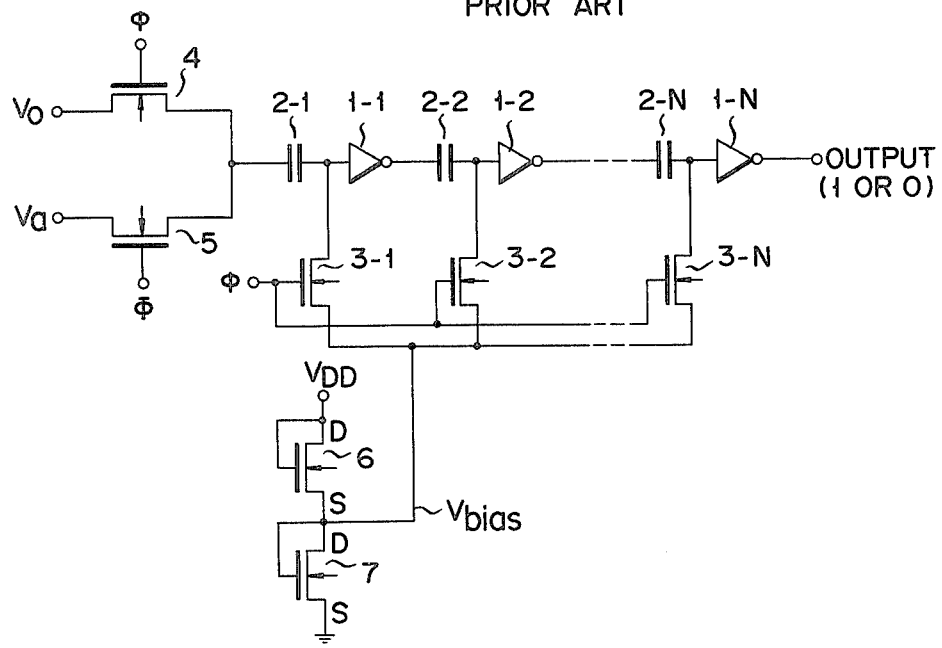
FIG. 1 shows the circuit arrangement of a prior art comparator.
Figure 2:
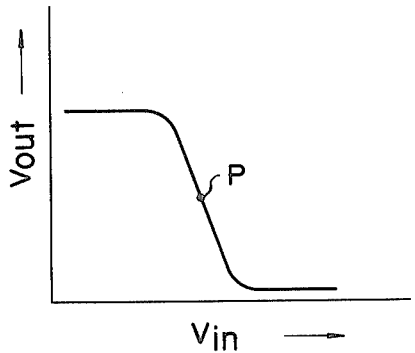
FIG. 2 illustrates a typical transfer characteristic of the inverter of FIG. 1.
Figure 3:
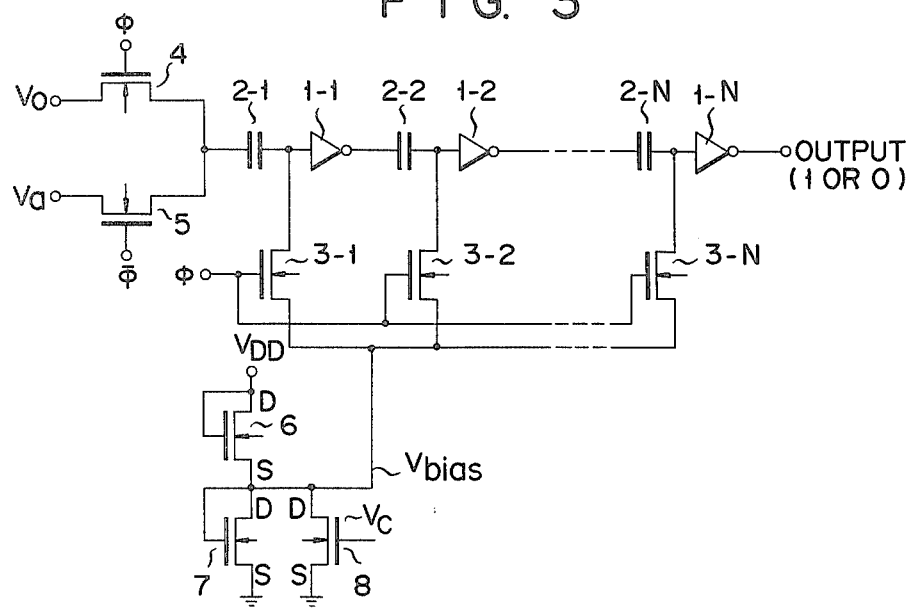
FIG. 3 indicates a circuit arrangement of a voltage comparator according to one embodiment of this invention which is provided with an improved bias circuit.

The parts of FIG. 3 showing the arrangement of one embodiment of this invention which are the same as those of FIG. 1 are respectively denoted by the same numerals, description thereof being omitted.

Figure 4:
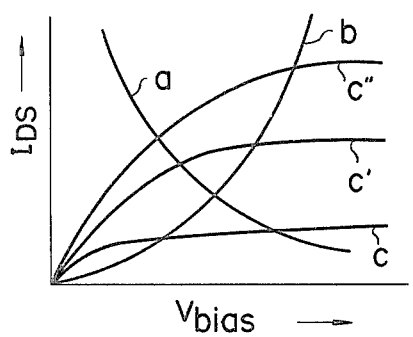
FIGS. 4 and 5 show the characteristic of output bias voltage of the bias circuit of FIG. 3 relative to the drain current of MOS transistors of the bias circuit.
Figure 5:
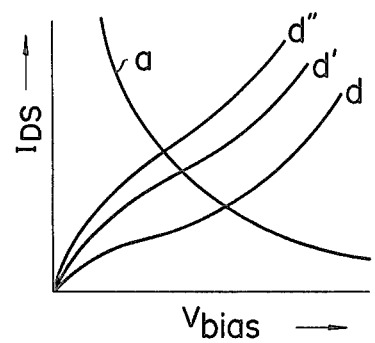

A bias circuit included in a voltage comparator embodying this invention comprises first and second MOS transistors 6 and 7 whose gate electrodes are connected to the drain electrodes and whose source—drain paths are connected in series, and a third N-channel MOS transistor 8 connected in parallel to the second MOS transistor 7 acting as a control transistor. The gate electrode of third MOS control transistor 8 is externally impressed with a control voltage to ensure an optimum operating point for the inverting amplifiers. FIGS. 4 and 5 illustrate the drain current $I_{DS}$—output bias voltage $V_{bias}$ characteristic of the MOS transistors 6, 7, 9 of the bias circuit. The curve a denotes the characteristic of MOS transistor 6, whose drain current $I_{DS}$ decreases according as the output bias voltage $V_{bias}$ increases, namely, the drain-source voltage $V_{DS}$ thereof decreases. The curve b indicates the characteristic of MOS transistor 7, whose drain current $I_{DS}$ increases, according as the output bias voltage $V_{bias}$ increases. The curve C, C' and C'' denote the characteristic of third MOS control transistor 8 with the control voltage $V_c$ taken as a parameter. The drain current $I_{DS}$ of third MOS control transistor 8 is increased, according as the control voltage $V_c$ rises.

Figure 6:
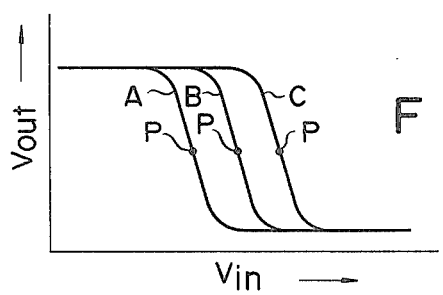
FIG. 6 indicates the transfer characteristics of the inverters included in the voltage comparator with manufacturing process variations.

The curves d, d' and d'' of FIG. 5 indicate the resultant characteristic of parallel-connected MOS transistors 7 and 8. As apparent from FIG. 5, the output voltage $V_{bias}$ of the bias circuit is a voltage corresponding to intersections between the curve a showing the characteristic of the MOS transistor 6 and the curves d, d' and d'' showing the resultant characteristic of parallel-connected MOS transistors 7 and 8. Since the resultant characteristic of the MOS transistors 7 and 8 is defined by the control voltage $V_c$ impressed on the gate of third MOS control transistor 8, the output bias voltage $V_{bias}$ can be changed by the control voltage $V_c$. As seen from the curves A, B and C of FIG. 6, the operation point of the inverting amplifiers 1-1, 1-2 and 1-N can be set at an optimum point by adjusting the control voltage impressed on the gate electrode of third MOS control transistor 8, regardless of variations in the transfer characteristic of the inverters.

Figure 7:
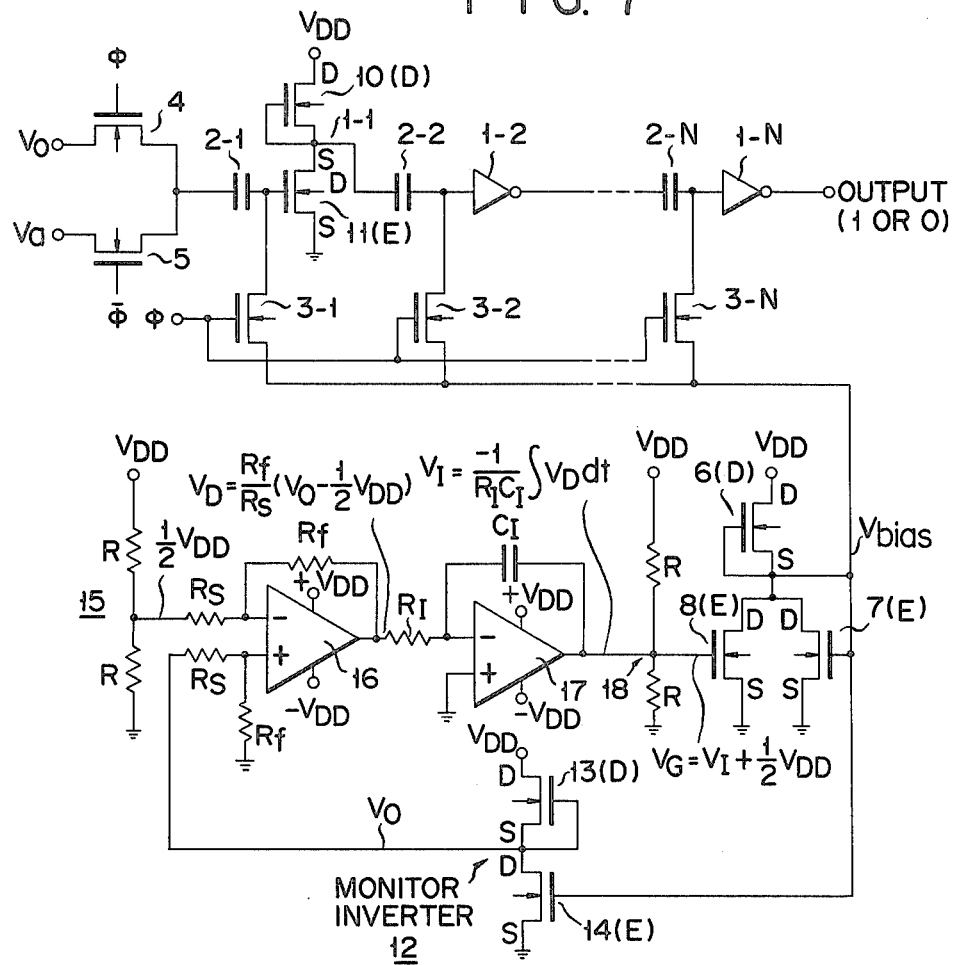
FIG. 7 shows the circuit arrangement of a voltage comparator according to a second embodiment of this invention.
Figure 8:
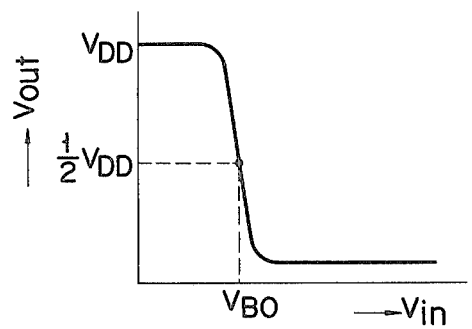
FIG. 8 indicates a typical transfer characteristic of the inverter of FIG. 7 provided with a depletion type load MOS transistor and an enhancement type driver MOS transistor.

FIG. 7 shows the arrangement of a voltage comparator according to another embodiment of this invention. The parts of FIG. 7 the same as those of FIG. 3 are respectively denoted by the same numerals. The inverter 1-1 selected as a typical example from the inverters 1-1, 1-2 and 1-N included in the embodiment of FIG. 7 comprises a depletion type load MOS transistor 10 whose gate is connected to the source and an enhancement type driver transistor 11. The MOS transistor 6 of the bias circuit is also of depletion type and has the gate connected to the source. The other MOS transistors 7 and 8 are of enhancement type. FIG. 8 illustrates a typical transfer characteristic of an MOS inverter formed of the depletion type load MOS transistor 10 and enhancement type driver MOS transistor 11. A maximum output voltage from the MOS inverter is substantially equal to the source voltage $V_{DD}$. Therefore, an optimum bias voltage $V_{BO}$ supplied to the inverter may be taken to the equal to half the source voltage $V_{DD}$.

The embodiment of FIG. 7 includes a monitor inverter 12 for detecting bias voltage $V_{bias}$ impressed on the inverters 1-1, 1-2 and 1-N. This monitor inverter 12 is formed of a depletion type load MOS transistor 13 whose gate is connected to the source and an enhancement type driver transistor 14 whose gate is impressed with the bias voltage $V_{bias}$, so that the monitor inverter has the same transfer characteristic as the inverters 1-1, 1-2 and 1-N. Where the bias voltage $V_{bias}$ is equal to the optimum bias voltage $V_{BO}$, then the monitor inverter 12 produces an output voltage $V_o$ equal to half the source voltage $V_{DD}$. As seen from FIG. 8, $V_o > \frac{1}{2}V_{DD}$ results in case of $V_{bias} < V_{BO}$, and $V_o < \frac{1}{2}V_{DD}$ is obtained in case of $V_{bias} > V_{BO}$. The embodiment of FIG. 7 comprises a voltage divider 15 for generating a referential voltage equal to half the source voltage $V_{DD}$. The output voltage from the voltage divider 15 which is equal to half the source voltage $V_{DD}$ and the output voltage $V_c$ from the monitor inverter 12 are supplied to a differential amplifier 16, which in turn generates an output voltage $V_D = Rf/Rs (V_o - \frac{1}{2}V_{DD})$ proportional to the difference between the output referential voltage $\frac{1}{2}V_{DD}$ from the voltage divider 15 and the output voltage $V_o$ from the monitor inverter 12. The output voltage $V_D$ from the differential amplifier 16 is conducted to an integrator 17, which in turn produces an output voltage $V_I = -(1/R1\,C1)\int V_D dt$. The integator 17 continues to integrate the output voltage $V_D$ from the differential amplifier 16 until the output voltage $V_c$ of monitor inverter 12 becomes equal to the reference voltage $\frac{1}{2}V_{DD}$ of the voltage divider 15. When $V_c$ becomes equal to $\frac{1}{2}V_{DD}$, the integrator 17 stops integration and thereafter holds an output voltage obtained at the end of integration. The embodiment of FIG. 7 further comprises a second voltage divider for producing a referential voltage $\frac{1}{2}V_{DD}$. This referential voltage $\frac{1}{2}V_{DD}$ is added to the output voltage $V_I$ from the integrator 17. A sum $V_G$ of these voltages is supplied to the third control MOS transistor 8 in the form of $V_G = V_I + \frac{1}{2}V_{DD}$.

There will now be described the operation of a voltage comparator according to the embodiment of FIG. 7. Now let it be assumed that when an output referential voltage $\frac{1}{2}V_{DD}$ from the second voltage divider 18 is supplied to the gate of the third MOS control transistor 8, the bias voltage $V_{bias}$ is lower than the optimum bias voltage $V_{BO}$. Then the monitor inverter 12 issues an output voltage $V_c$ higher than the referential voltage $\frac{1}{2}V_{DD}$. Accordingly, the differential amplifier 16 has a positive value, causing the output voltage $V_I$ from the integrator 17 to be progressively decreased from zero volt. The output voltage $V_I$ from the integrator 17 is added to the referential voltage $\frac{1}{2}V_{DD}$. A sum of these voltages is conducted to the gate of the third MOS control transistor 8 so that its gate voltage $V_G$ progressively decreases. As the result, the bias voltage $V_{bias}$ increases with time. At this time, the monitor inverter 12 generates a progressively increasing voltage $V_c$. When the bias voltage $V_{bias}$ becomes equal to the optimum bias voltage $V_{BO}$, then the monitor inverter 12 produces an output voltage $V_c$ equal to the referential voltage $\frac{1}{2}V_{DD}$, preventing the differential amplifier 16 from generating output voltage $V_D$. The integrator 17 holds the integrated voltage (negative voltage in this case obtained when the output voltage of the differential amplifier 16 becomes zero). As the result, the gate of third MOS control transistor 8 is continued to be supplied with such gate voltage $V_G$ ($<\frac{1}{2}V_{DD}$) as renders the biasvoltage $V_{bias}$ equal to the optimum bias voltage $V_{BO}$. The operation of the voltage comparator of this invention when the bias voltage $V_{bias}$ is initially higher than the optimum bias voltage $V_{BO}$ will be easily understood from the foregoing description referring to the case where the bias voltage $V_{bias}$ was initially lower than $V_{BO}$.

What we claim is:

1. A comparator for comparing a first input voltage signal with a second input voltage signal to provide at an output thereof an output voltage signal of a logic level 1 or 0 depending on the relationship between magnitudes of the first and second input voltage signals comprising:

a plurality of capacitively cascade-connected inverting amplifier stages each having an MOS inverter and an input-coupling capacitive element connected to an input of said inverter;

input circuit means for alternately coupling the first and second input voltage signals to be compared to the input-coupling capacitive element of the first inverting amplifier stage;

a bias circuit including first and second MOS transistors having their source-drain paths connected in series across a power source, each of said first and second MOS transistors having its gate electrode connected to its drain electrode, and a third MOS transistor having its source-drain path connected in parallel with that of said second MOS transistor and its gate electrode connected to receive a control voltage; and switching means for coupling the junction of said series-connected first and second MOS transistors to the input of said inverter of each of said cascade-connected inverting amplifier stages at a predetermined time interval.

2. A comparator for comparing a first input voltage signal with a second input voltage signal to provide at an output thereof an output voltage signal of a logic level 1 or 0 depending on the relationship between magnitudes of the first and second input voltage signals comprising:

a plurality of capacitively cascade-connected inverting amplifier stages each having an MOS inverter and an input-coupling capacitive element connected to an input of said MOS inverter;

input circuit means for alternately coupling the first and second input voltage signals to be compared to said input-coupling capacitive element of a first stage of said cascade-connected inverting amplifier stages;

bias circuit means for producing a bias voltage at its output; and switching means for coupling the bias voltage of said bias circuit means to the input of said inverter of each of said cascade-connected inverting amplifier stages at a predetermined time interval;

said bias circuit means including first and second MOS transistors having their source-drain paths connected in series across a power source with the junction of said series-connected first and second MOS transistors connected to said output of said bias circuit, each of said first and second MOS transistors having its gate electrode connected to its drain electrode; a third MOS transistor having its source-drain path connected in parallel with that of said second MOS transistor; a monitoring MOS inverter having its input connected to said output of said bias circuit, said monitoring MOS inverter having substantially the same transfer characteristic as that of said inverter of each of said cascade-connected inverting amplifier stages; and control circuit means responsive to an output voltage of said monitoring inverter to apply a control voltage to a gate electrode of said third MOS transistor to thereby control the bias voltage of said bias circuit.

3. A comparator according to claim 2 wherein said control circuit means comprises a first voltage divider for producing a reference voltage; a differential amplifier for producing an output voltage proportional to the difference between the reference voltage of said first voltage divider and the output voltage of said monitoring inverter; an integrator circuit connected to an output of said integrator circuit; and a second voltage divider having its output connected to the gate electrode of said third transistor and to an output of said integrator circuit.

4. A comparator according to claim 2 wherein said inverters of said cascade-connected inverting amplifier stages and said monitoring inverter each have a depletion type load MOS transistor and an enhancement type driver MOS transistor, and said first MOS transistor of said bias circuit is of depletion type and said second and third MOS transistors of said bias circuit are of enhancement type.

* * * * *